United States Patent
Watanabe et al.

(10) Patent No.: US 10,103,232 B2
(45) Date of Patent: Oct. 16, 2018

(54) SEMICONDUCTOR DEVICE AND METHOD FOR MANUFACTURING SEMICONDUCTOR DEVICE

(71) Applicant: OSAKA UNIVERSITY, Osaka (JP)

(72) Inventors: Heiji Watanabe, Suita (JP); Takahiro Yamada, Suita (JP); Mikito Nozaki, Suita (JP); Takuji Hosoi, Suita (JP); Takayoshi Shimura, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 0 days.

(21) Appl. No.: 15/687,302

(22) Filed: Aug. 25, 2017

(65) Prior Publication Data

US 2018/0061954 A1 Mar. 1, 2018

Related U.S. Application Data

(63) Continuation of application No. PCT/JP2016/075465, filed on Aug. 31, 2016.

(51) Int. Cl.
| | |
|---|---|
| *H01L 29/778* | (2006.01) |
| *H01L 29/40* | (2006.01) |
| *H01L 21/02* | (2006.01) |
| *H01L 21/285* | (2006.01) |
| *H01L 29/20* | (2006.01) |
| *H01L 21/28* | (2006.01) |
| *H01L 29/51* | (2006.01) |

(52) U.S. Cl.
CPC ........ *H01L 29/408* (2013.01); *H01L 21/0254* (2013.01); *H01L 21/02241* (2013.01); *H01L 21/02389* (2013.01); *H01L 21/02483* (2013.01); *H01L 21/28008* (2013.01); *H01L 21/28575* (2013.01); *H01L 29/2003* (2013.01); *H01L 29/513* (2013.01); *H01L 29/517* (2013.01)

(58) Field of Classification Search
None
See application file for complete search history.

(56) References Cited

U.S. PATENT DOCUMENTS

| | | | |
|---|---|---|---|
| 6,770,922 B2 | 8/2004 | Inoue et al. | |
| 7,037,817 B2 | 5/2006 | Inoue et al. | |
| 2003/0160265 A1 | 8/2003 | Inoue et al. | |
| 2004/0238860 A1 | 12/2004 | Inoue et al. | |
| 2012/0325310 A1* | 12/2012 | Chichibu | .......... H01L 31/02246 136/256 |

(Continued)

FOREIGN PATENT DOCUMENTS

| | | |
|---|---|---|
| JP | 2001-320054 A | 11/2001 |
| JP | 2003-258258 A | 9/2003 |

(Continued)

*Primary Examiner* — Cuong Q Nguyen
(74) *Attorney, Agent, or Firm* — Studebaker & Brackett PC

(57) ABSTRACT

A semiconductor device (100) includes a base layer (10), an interface layer (20), and a deposition layer (30). The base layer (10) includes a nitride semiconductor that contains gallium. The interface layer (20) is adjacent to the base layer (10). The interface layer (20) contains gallium oxide. The deposition layer (30) is adjacent to the interface layer (20). The deposition layer (30) has a wider band gap than the interface layer (20). The interface layer (20) preferably has crystallinity. The interface layer (20) preferably contains α-phase $Ga_2O_3$.

10 Claims, 16 Drawing Sheets

(56) References Cited

U.S. PATENT DOCUMENTS

2015/0060873 A1* 3/2015 Chiu .................. H01L 29/778
 257/76
2015/0279982 A1 10/2015 Yamamoto et al.

FOREIGN PATENT DOCUMENTS

JP   2014-099495 A   5/2014
WO   2014/057906 A1  4/2014

* cited by examiner

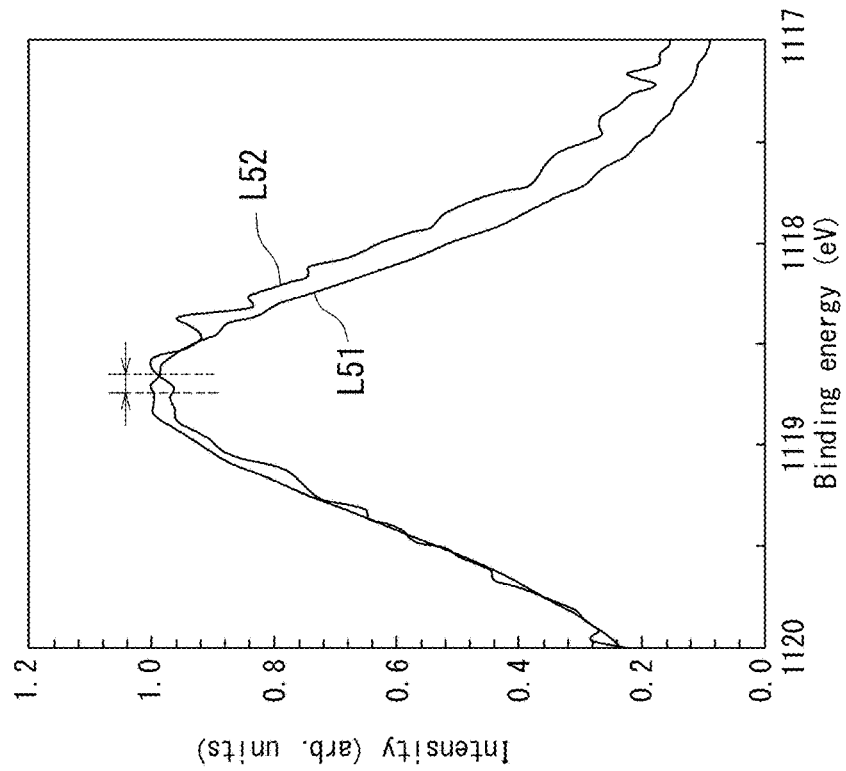
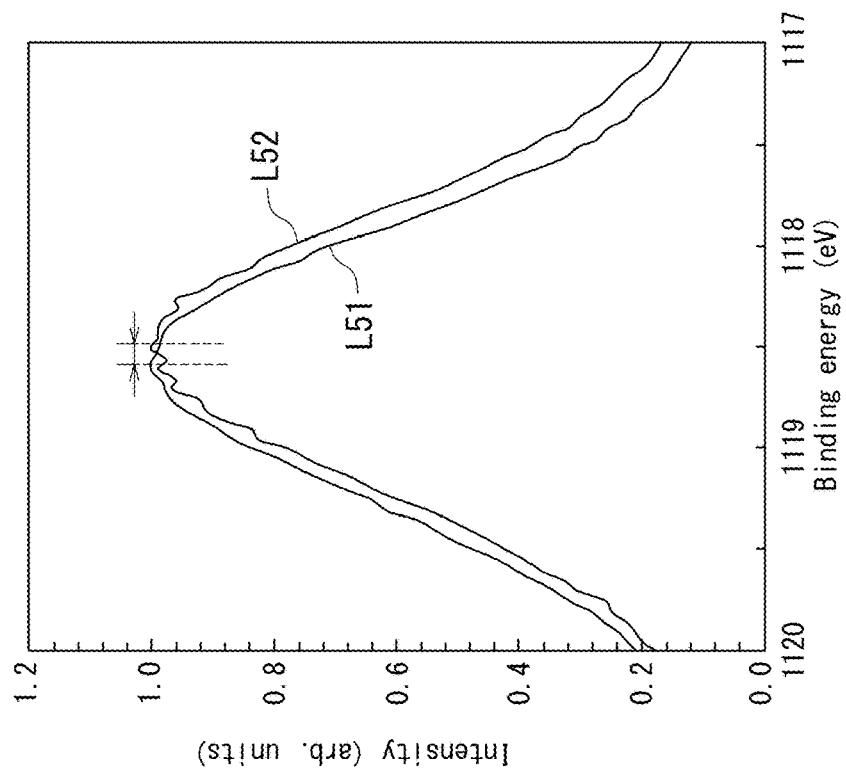

SEMICONDUCTOR DEVICE AND METHOD FOR MANUFACTURING SEMICONDUCTOR DEVICE

CROSS-REFERENCE TO RELATED APPLICATIONS

The present application is a continuation of International Application No. PCT/JP2016/075465, filed on Aug. 31, 2016. The contents of this application are incorporated herein by reference in their entirety.

TECHNICAL FIELD

The present invention relates to a semiconductor device and a method for manufacturing a semiconductor device.

BACKGROUND ART

SiC semiconductors made of SiC are commonly known (for example, Patent Literature 1). Also, GaN semiconductors have attracted attention in recent years as power device materials that give performance superior to that of the SiC semiconductors. MOS structure is formed by depositing a thin insulating film such as a silicon oxide ($SiO_2$) film on a surface of a GaN substrate.

CITATION LIST

Patent Literature

[Patent Literature 1] Japanese Patent Application Laid-Open Publication No. 2014-99495

SUMMARY OF INVENTION

Technical Problem

However, it has been difficult to form a high-quality insulating film on a GaN semiconductor. The above difficulty resulted in problems in interface electrical characteristics between the GaN semiconductor and the insulating film.

The present invention was made in view of the above problem, and it is an object of the present invention to provide a semiconductor device having excellent interface electrical characteristics and an apparatus for manufacturing a semiconductor device.

Solution to Problem

A semiconductor device according to the present invention includes a base layer, an interface layer, and a deposition layer. The base layer includes a nitride semiconductor that contains gallium. The interface layer is adjacent to the base layer. The interface layer contains gallium oxide. The deposition layer is adjacent to the interface layer. The deposition layer has a wider band gap than the interface layer.

In an embodiment, the interface layer has crystallinity.

In an embodiment, the interface layer contains α-phase $Ga_2O_3$.

In an embodiment, the interface layer further contains β-phase $Ga_2O_3$. The α-phase $Ga_2O_3$ occupies a larger volume in the interface layer than the β-phase $Ga_2O_3$.

In an embodiment, crystal orientation of the gallium oxide in the interface layer matches with crystal orientation of the nitride semiconductor in the base layer.

In an embodiment, the interface layer has a thickness greater than 0 nm and no greater than 10 nm.

In an embodiment, the interface layer has a smaller thickness than the deposition layer.

In an embodiment, a root mean square of surface roughness of the interface layer is greater than 0 nm and no greater than 5 nm.

In an embodiment, the root mean square of the surface roughness of the interface layer is greater than 0 nm and no greater than 1 nm.

A method for manufacturing a semiconductor device according to the present invention includes: preparing a base layer including a nitride semiconductor that contains gallium; forming an interface layer containing gallium oxide by performing treatment on a surface of the base layer; and forming a deposition layer having a wider band gap than the interface layer.

In an embodiment, the treatment includes oxidation.

In an embodiment, the oxidation is any one of: dry oxidation performed at a temperature of at least 800° C. and no greater than 1000° C.; oxidation using an oxidizing agent other than oxygen molecules; radical oxidation using active oxygen; oxidation performed in a solution; and thermal treatment performed after formation of the gallium oxide at room temperature.

In an embodiment, in the forming the deposition layer, the deposition layer is formed adjacent to the interface layer. The deposition layer is formed after formation of the interface layer.

In an embodiment, in the forming the deposition layer, the deposition layer is formed adjacent to the base layer. The interface layer is formed after formation of the deposition layer.

In an embodiment, the treatment includes sputtering.

Advantageous Effects of Invention

Interface electrical characteristics between a semiconductor and an insulating film can be improved in the semiconductor device of the present invention.

BRIEF DESCRIPTION OF DRAWINGS

FIGS. 9A and 9B illustrate results of XPS analysis.

DESCRIPTION OF EMBODIMENTS

Figure 1:
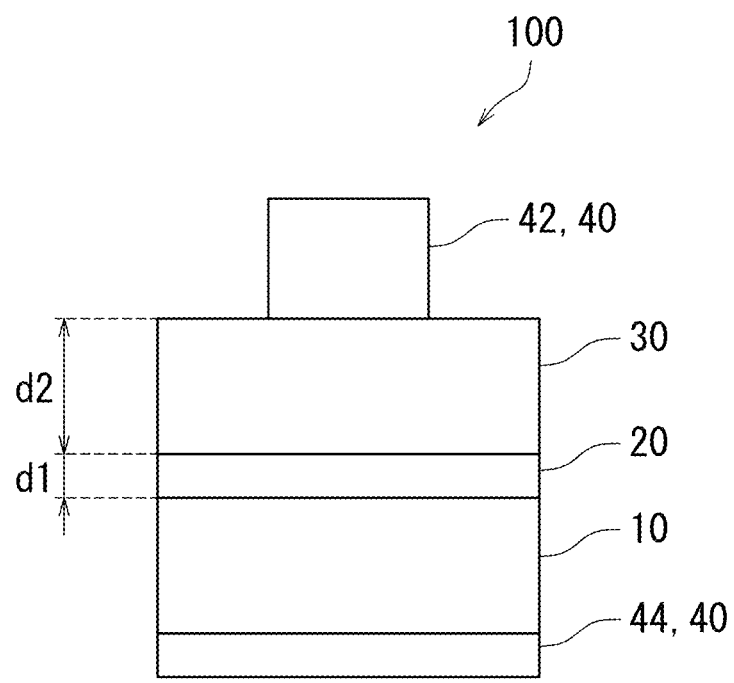
FIG. 1 is a cross-sectional view illustrating a semiconductor device according to an embodiment of the present invention.

The following explains embodiments of the present invention with reference to the drawings. Elements in the drawings that are the same or equivalent are marked by the same reference signs, and explanation of which will not be repeated.

The following explains a semiconductor device 100 according to an embodiment of the present invention with reference to FIG. 1. FIG. 1 is a cross-sectional view illustrating the semiconductor device 100 according to the embodiment of the present invention.

As illustrated in FIG. 1, the semiconductor device 100 includes a base layer 10, an interface layer 20, a deposition layer 30, and electrode layers 40.

The base layer 10 includes a nitride semiconductor. The nitride semiconductor contains gallium (Ga). The nitride semiconductor is for example a gallium nitride (GaN) substrate or an aluminum gallium nitride (AlGaN) substrate. In the present embodiment, the base layer 10 is a silicon (Si) substrate including gallium nitride (GaN) formed thereon. In the present description, a silicon (Si) substrate including gallium nitride (GaN) formed thereon may be referred to as a GaN/Si substrate.

The interface layer 20 is adjacent to the base layer 10. The interface layer 20 contains gallium oxide ($Ga_2O_3$). The interface layer 20 may further contain nitrogen oxide (NO). The interface layer 20 has a thickness d1 of for example greater than 0 nm and no greater than 10 nm. Preferably, the thickness d1 of the interface layer 20 is for example greater than 0 nm and no greater than 5 nm. More preferably, the thickness d1 of the interface layer 20 is for example greater than 0 nm and no greater than 1 nm. The thickness d1 of the interface layer 20 is preferably smaller than a thickness d2 of the deposition layer 30. For example, the thickness d1 of the interface layer 20 is 5 nm and the thickness d2 of the deposition layer 30 is 15 nm.

The deposition layer 30 is adjacent to the interface layer 20. The deposition layer 30 has a wider band gap than the interface layer 20. The deposition layer 30 contains for example silicon oxide ($SiO_2$), aluminum oxide ($Al_2O_3$), or hafnium oxide ($HfO_2$). The deposition layer 30 functions as an insulating film. Therefore, difference in band gap between the deposition layer 30 and the interface layer 20 is preferably large. The band gap of gallium oxide ($Ga_2O_3$) in the deposition layer 30 is about 4.9 eV. Accordingly, the band gap of the deposition layer 30 is preferably for example 6.0 eV or more. For this reason, the deposition layer 30 preferably contains silicon oxide ($SiO_2$) having a band gap of about 8.9 eV or aluminum oxide ($Al_2O_3$) having a band gap of about 7.0-8.0 eV.

The electrode layers 40 include a first electrode layer 42 and a second electrode layer 44. The first electrode layer 42 is adjacent to the deposition layer 30. The first electrode layer 42 is for example made of nickel. The second electrode layer 44 is adjacent to the base layer 10. The second electrode layer 44 is for example made of aluminum.

As explained with reference to FIG. 1, the semiconductor device 100 includes the interface layer 20 that contains gallium oxide between the base layer 10 and the deposition layer 30. This configuration can improve interface electrical characteristics between the semiconductor and the insulating film. For example, frequency dispersion of C-V curves can be reduced. Also, occurrence of leakage current can be reduced. As a result, the semiconductor device 100 is suitably used for power semiconductors.

Figure 2A:
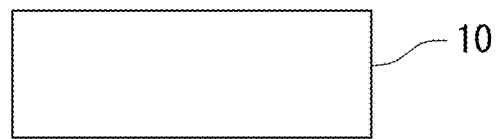
FIGS. 2A to 2C are cross-sectional views illustrating a method for manufacturing a semiconductor device according to an embodiment of the present invention.
Figure 2B:
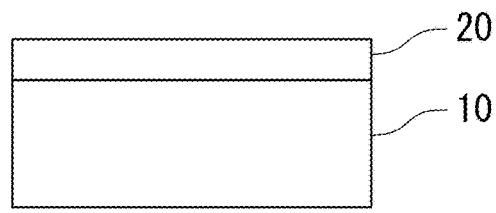
Figure 2C:
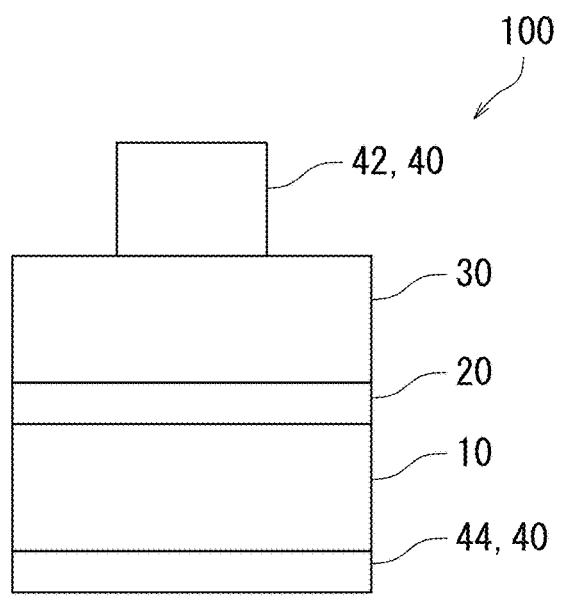

The following explains a method for manufacturing the semiconductor device 100 according to an embodiment of the present invention with reference to FIGS. 2A to 2C. FIGS. 2A to 2C are cross-sectional views illustrating the method for manufacturing the semiconductor device 100 according to the embodiment of the present invention.

As illustrated in FIG. 2A, the base layer 10 is prepared.

As illustrated in FIG. 2B, the interface layer 20 is formed by performing treatment on a surface of the base layer 10. The interface layer 20 contains gallium oxide ($Ga_2O_3$). The treatment in the present embodiment is oxidation. Examples of oxidation include dry oxidation performed at a temperature of at least 800° C. and no greater than 1000° C. Such oxidation is performed for example for 30 minutes.

As illustrated in FIG. 2C, the deposition layer 30 is formed. In the present embodiment, the deposition layer 30 is formed adjacent to the interface layer 20. The deposition layer 30 has a wider band gap than the interface layer 20. Thereafter, the electrode layers 40 are formed. Specifically, the first electrode layer 42 is formed adjacent to the deposition layer 30. Also, the second electrode layer 44 is formed adjacent to the base layer 10.

Figure 3:
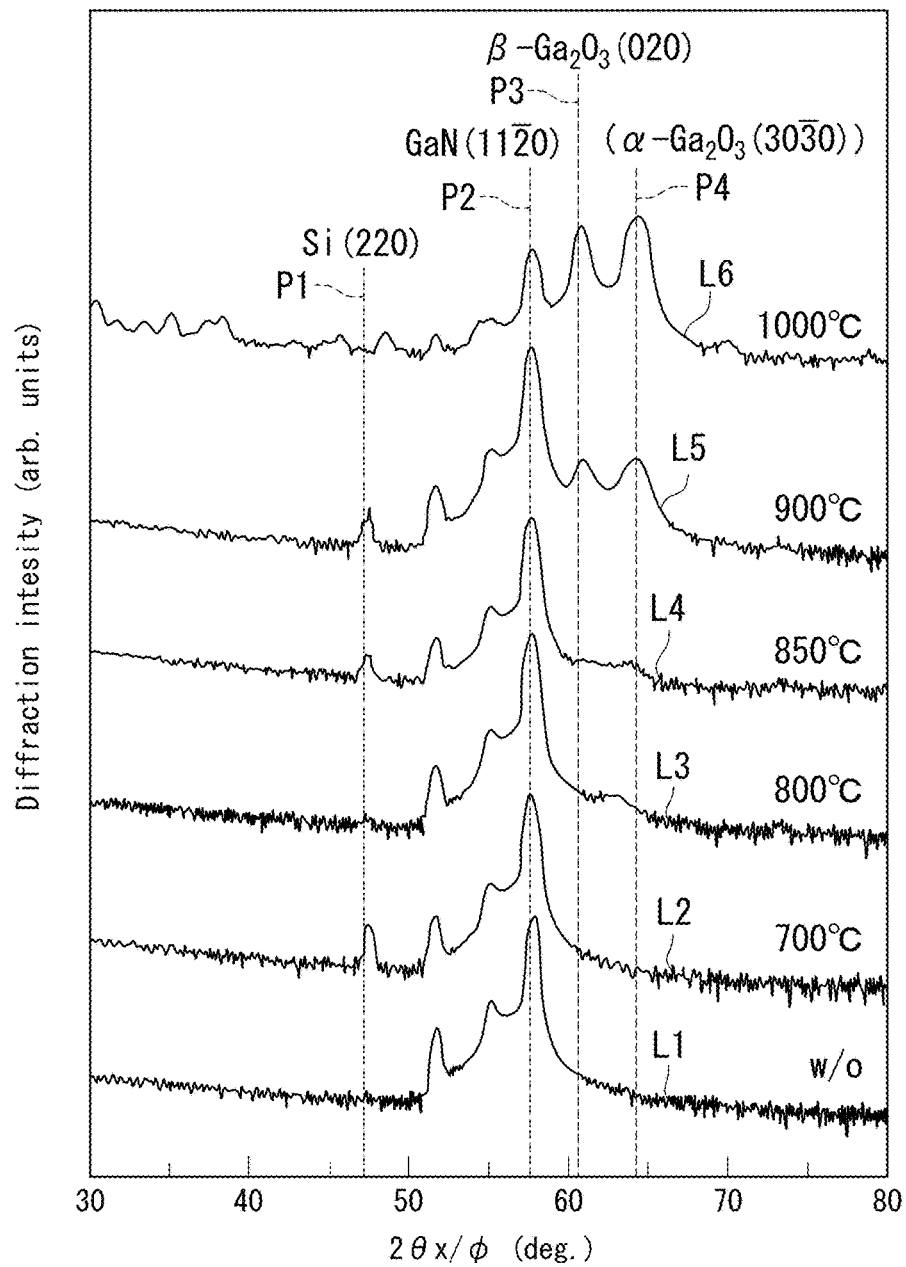
FIG. 3 illustrates X-ray diffraction spectra of a semiconductor device according to an embodiment of the present invention.

The following explains with reference to FIG. 3 that the interface layer 20 preferably has crystallinity. The interface layer 20 preferably has crystallinity. FIG. 3 illustrates X-ray diffraction spectra of the semiconductor device 100 according to an embodiment of the present invention. In FIG. 3, the horizontal axis represents diffraction angle and the vertical axis represents diffraction intensity (arbitrary units). Reference sign P1 indicates a Bragg angle corresponding to Si (220). P2 indicates a Bragg angle corresponding to GaN (11-20). P3 indicates a Bragg angle corresponding to β-$Ga_2O_3$ (020). P4 indicates a Bragg angle corresponding to α-$Ga_2O_3$ (30-30). Data L1 indicates an X-ray diffraction spectrum in a situation in which no thermal oxidation was performed. Data L2, L3, L4, L5, and L6 indicate X-ray diffraction spectra in situations in which thermal oxidation was performed at 700° C., 800° C., 850° C., 900° C., and 1000° C., respectively. In the present description, "–" used in notation of a Miller index is a bar directly prefixed to an index, and a negative index is indicated by prefixing "−" to the index.

As indicated in FIG. 3, a diffraction peak P4 of α-phase $Ga_2O_3$ can be observed in addition to a diffraction peak P3 of β-phase $Ga_2O_3$. It is known that crystals of gallium oxide ($Ga_2O_3$) formed by thermal oxidation are typically β-phase crystals. By contrast, long-term research by the inventor confirmed that crystals of gallium oxide ($Ga_2O_3$) in the semiconductor device 100 are mixed crystals of α-phase crystals and β-phase crystals. That is, the interface layer 20 contains α-phase $Ga_2O_3$ and β-phase $Ga_2O_3$. Further, as indicated in FIG. 3, diffraction intensity of α-phase $Ga_2O_3$ at the diffraction peak P4 is greater than diffraction intensity of β-phase $Ga_2O_3$ at the diffraction peak P3. Therefore, α-phase $Ga_2O_3$ occupies a larger volume in the interface layer 20 than β-phase $Ga_2O_3$.

Further, the diffraction peak P4 of α-phase $Ga_2O_3$ can be observed from data L4.

Figure 4C:
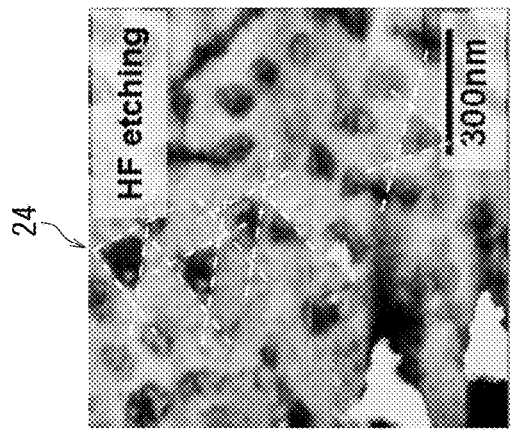
FIG. 4C is a photograph of an atomic force microscope image of the base layer.
Figure 4D:
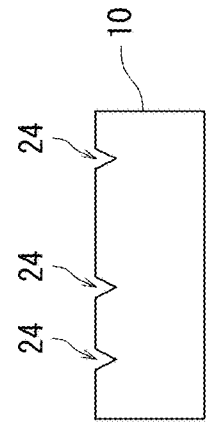
FIG. 4D is a cross-sectional view illustrating the base layer.
Figure 4A:
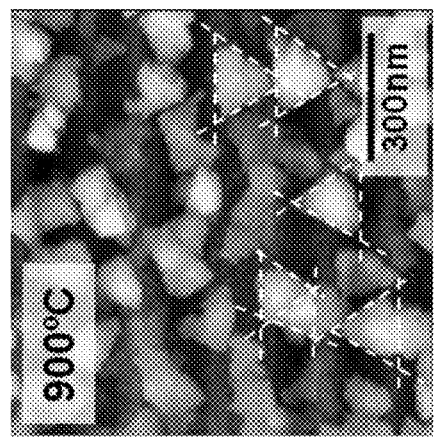
FIG. 4A is a photograph of an atomic force microscope image of a base layer and an interface layer.
Figure 4B:
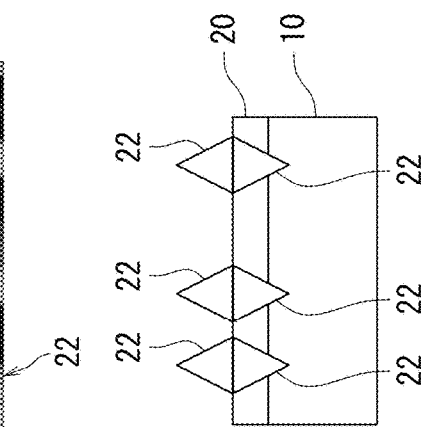
FIG. 4B is a cross-sectional view illustrating the base layer and the interface layer.

The following explains with reference to FIGS. 4A to 4D that crystal orientation of gallium oxide ($Ga_2O_3$) in the interface layer 20 preferably matches with crystal orientation of the nitride semiconductor in the base layer 10. FIG. 4A is a photograph of an atomic force microscope (AFM) image of the base layer 10 and the interface layer 20. FIG. 4C is a photograph of an atomic force microscope image of the base layer 10. FIG. 4B is a cross-sectional view illustrating the base layer 10 and the interface layer 20. FIG. 4D is a cross-sectional view illustrating the base layer 10. FIG. 4A is a photograph of a sample obtained by performing thermal oxidation on the base layer 10 at 900° C. FIG. 4C is a photograph of the sample of FIG. 4A to which etching was performed using hydrofluoric acid.

In FIG. 4A, gallium oxide ($Ga_2O_3$) crystals 22 are surrounded by dash lines. As shown in FIG. 4A, the gallium oxide ($Ga_2O_3$) crystals 22 are triangular. Further, as shown in FIG. 4A, the gallium oxide ($Ga_2O_3$) crystals 22 are aligned in a specific direction.

In FIG. 4C, parts appearing black are surrounded by dash lines. In FIG. 4C, pits 24 each having substantially the same size as parts surrounded by the dash lines in FIG. 4A, which are the gallium oxide ($Ga_2O_3$) crystals 22, are formed. As such, the parts surrounded by the dash lines correspond to parts at which the gallium oxide ($Ga_2O_3$) crystals 22 were present before the etching. As shown in FIG. 4C, the parts surrounded by the dash lines are also aligned in a specific direction.

That is, crystals of the nitride semiconductor in the base layer 10 and crystals of gallium oxide ($Ga_2O_3$) in the interface layer 20 are oriented not in a random manner but are in contact with each other in a certain relationship of crystal orientation.

The results described above with reference to FIGS. 4A to 4D suggest that gallium oxide ($Ga_2O_3$) grows reflecting the crystal structure of the base layer 10 to be oriented in an in-plane direction.

Figure 5:
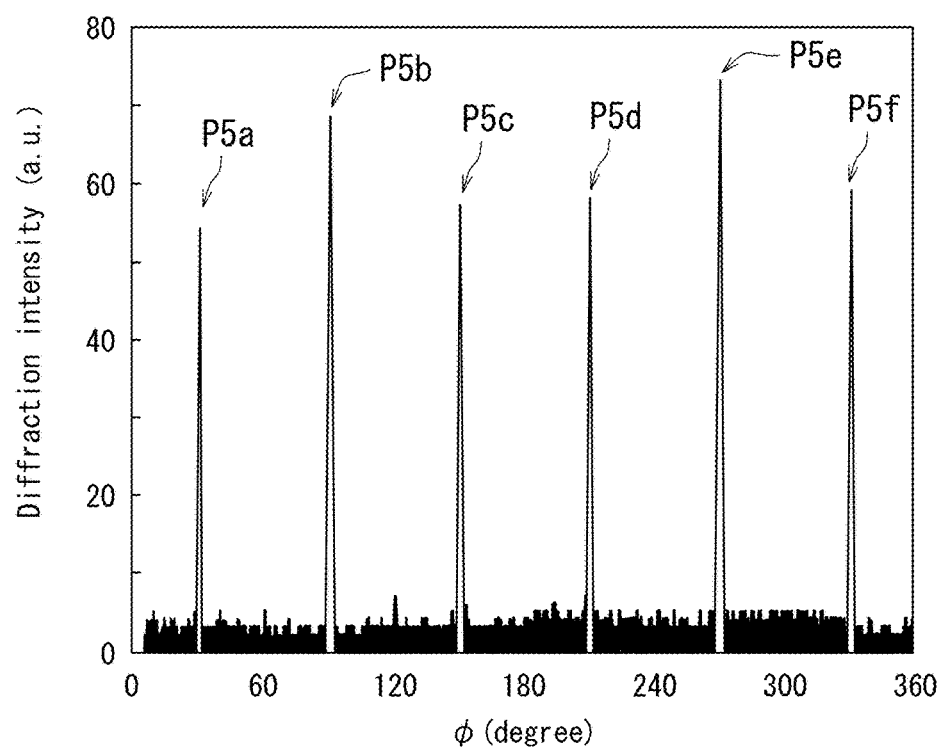
FIG. 5 illustrates an X-ray diffraction spectrum of a semiconductor device according to an embodiment of the present invention.

FIG. 5 illustrates an X-ray diffraction spectrum of the semiconductor device 100 according to an embodiment of the present invention. The X-ray diffraction spectrum illustrated in FIG. 5 was measured by rotating the semiconductor device 100. In FIG. 5, the horizontal axis represents rotation angle of the semiconductor device 100 and the vertical axis represents diffraction intensity (arbitrary units). Reference signs P5a to P5f indicate diffraction peaks of α-phase $Ga_2O_3$.

As indicated in FIG. 5, rotation angles of P5a, P5b, P5c, P5d, P5e, and P5f are about 30°, 90°, 150°, 210°, 270°, and 330°, respectively. That is, the diffraction peaks of α-phase $Ga_2O_3$ appear at intervals of rotation angle of 60°. Thus, results indicated in FIG. 5 also suggest that gallium oxide ($Ga_2O_3$) grows reflecting the crystal structure of the base layer 10 to be oriented in an in-plane direction.

In the semiconductor device 100 explained with reference to FIGS. 1 to 5, the base layer 10 is a silicon (Si) substrate including gallium nitride (GaN) formed thereon. However, the base layer 10 may be a gallium nitride (GaN) substrate including gallium nitride (GaN) formed thereon. In the present description, a gallium nitride (GaN) substrate including gallium nitride (GaN) formed thereon may be referred to as a free-standing GaN substrate.

Figure 6A:
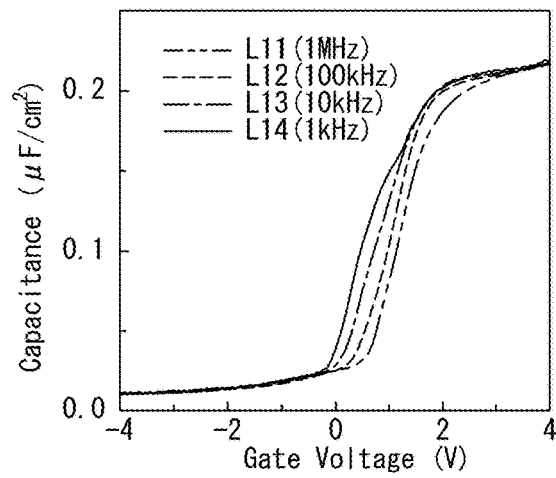
FIGS. 6A to 6C illustrate C-V characteristics of a semiconductor device according to an embodiment of the present invention.
Figure 6B:
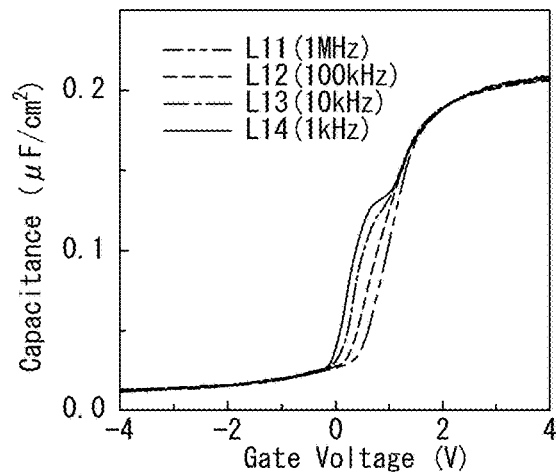
Figure 6C:
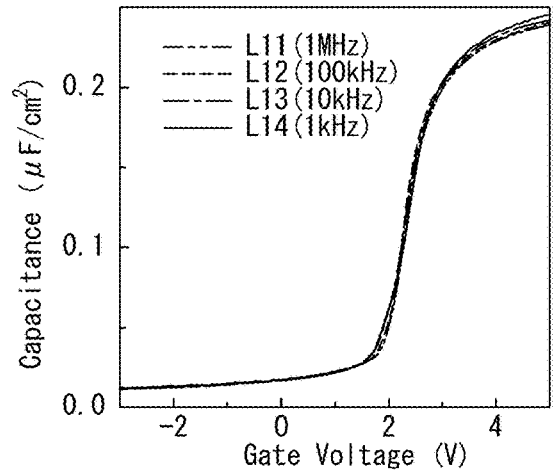

The following explains C-V characteristics of the semiconductor device 100 according to an embodiment of the present invention with reference to FIGS. 6A to 6C. FIGS. 6A to 6C illustrate the C-V characteristics of the semiconductor device 100 according to the embodiment of the present invention. In FIGS. 6A to 6C, the horizontal axis represents gate voltage and the vertical axis represents capacitance.

In FIGS. 6A to 6C, data L11 (dash-dot-dot line) indicates data measured at a measurement frequency of 1 MHz. Data L12 (dash line) indicates data measured at a measurement frequency of 100 kHz. Data L13 (dash-dot line) indicates data measured at a measurement frequency of 10 kHz. Data L14 (solid line) indicates data measured at a measurement frequency of 1 kHz. FIG. 6A illustrates data of a semiconductor device not subjected to thermal oxidation. FIG. 6B illustrates data of the semiconductor device 100 subjected to thermal oxidation at 800° C. FIG. 6C illustrates data of the semiconductor device 100 subjected to thermal oxidation at 900° C. Note that FIGS. 6A to 6C each illustrate only C-V curves as results of measurement in a direction from negative to positive in order to avoid complication of the drawings.

As indicated in FIG. 6A, frequency dispersion is significant in the semiconductor device not subjected to thermal oxidation. Further, an interface defect density determined by a conductance method is estimated to be $2.5 \times 10^{12}$ $cm^{-2}$ $eV^{-1}$.

As indicated in FIG. 6B, frequency dispersion converges in the semiconductor device 100 subjected to thermal oxidation at 800° C. as compared with the semiconductor device 100 in FIG. 6A not subjected to thermal oxidation. Further, the interface defect density determined by the conductance method is estimated to be $1.2 \times 10^{12}$ $cm^{-2} eV^{-1}$.

As indicated in FIG. 6C, frequency dispersion is hardly observed in the semiconductor device 100 subjected to thermal oxidation at 900° C. Further, the interface defect density determined by the conductance method is estimated to be $1.5 \times 10^{11}$ $cm^{-2} eV^{-1}$.

As explained above with reference to FIGS. 6A to 6C, frequency dispersion converges step by step in the samples subjected to thermal oxidation at 800° C. and 900° C. Thus, it was confirmed that interface characteristics improve as a result of providing the interface layer 20 between the base layer 10 and the deposition layer 30. Further, it was confirmed that frequency dispersion significantly converges by thermal oxidation performed at 900° C. Also, it was confirmed that the interface defect density becomes as small as $1.5 \times 10^{11}$ $cm^{-2} eV^{-1}$ by thermal oxidation performed at 900° C., resulting in improvement of interface characteristics.

Figure 7:
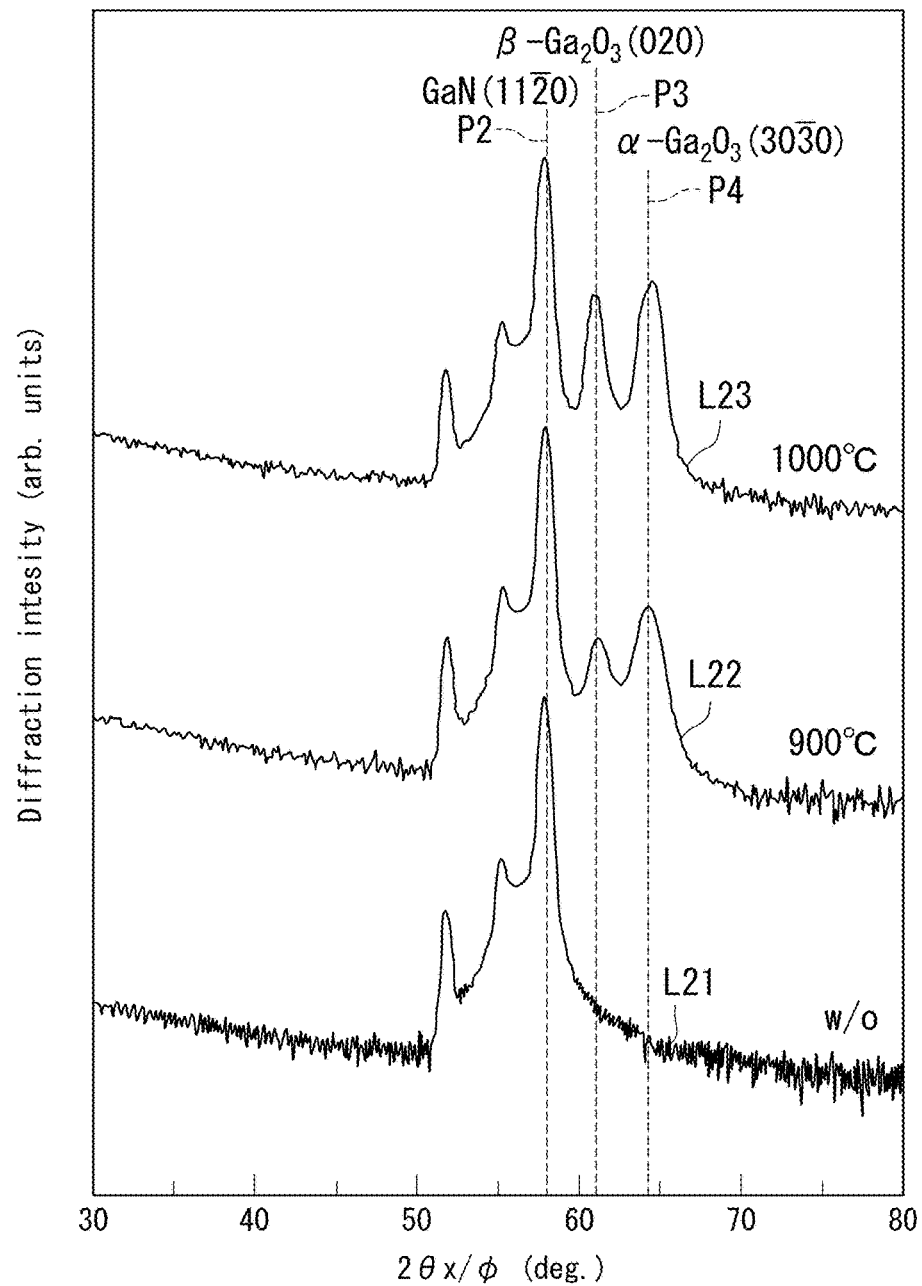
FIG. 7 illustrates X-ray diffraction spectra of a semiconductor device according to an embodiment of the present invention.

The following further explains the semiconductor device 100 according to an embodiment of the present invention with reference to FIG. 7. FIG. 7 illustrates X-ray diffraction spectra of the semiconductor device 100 according to the embodiment of the present invention. FIG. 7 illustrates X-ray diffraction spectra in a configuration in which the base layer 10 is a free-standing GaN substrate. In FIG. 7, the horizontal axis represents diffraction angle and the vertical axis represents diffraction intensity (arbitrary units). Reference sign P2 indicates a Bragg angle corresponding to GaN (11-20). P3 indicates a Bragg angle corresponding to β-$Ga_2O_3$ (020). P4 indicates a Bragg angle corresponding to α-$Ga_2O_3$ (30-30). Data L21 indicates an X-ray diffraction spectrum in a situation in which no thermal oxidation was performed. Data L22 and L23 indicate X-ray diffraction spectra in situations in which thermal oxidation was performed at 900° C. and 1000° C., respectively.

As indicated in FIG. 7, a diffraction peak P4 of α-phase $Ga_2O_3$ can be observed in addition to a diffraction peak P3 of β-phase $Ga_2O_3$. Similarly to the configuration in which the base layer 10 is a GaN/Si substrate explained with reference to FIG. 3, it was confirmed that crystals of gallium oxide ($Ga_2O_3$) in the semiconductor device 100 are mixed crystals of α-phase crystals and β-phase crystals. That is, the interface layer 20 contains α-phase $Ga_2O_3$ and β-phase $Ga_2O_3$. Also, as indicated in FIG. 7, diffraction intensity of α-phase $Ga_2O_3$ at the diffraction peak P4 is greater than diffraction intensity of β-phase $Ga_2O_3$ at the diffraction peak P3. As such, α-phase $Ga_2O_3$ occupies a larger volume in the interface layer 20 than β-phase $Ga_2O_3$.

Figure 8B:
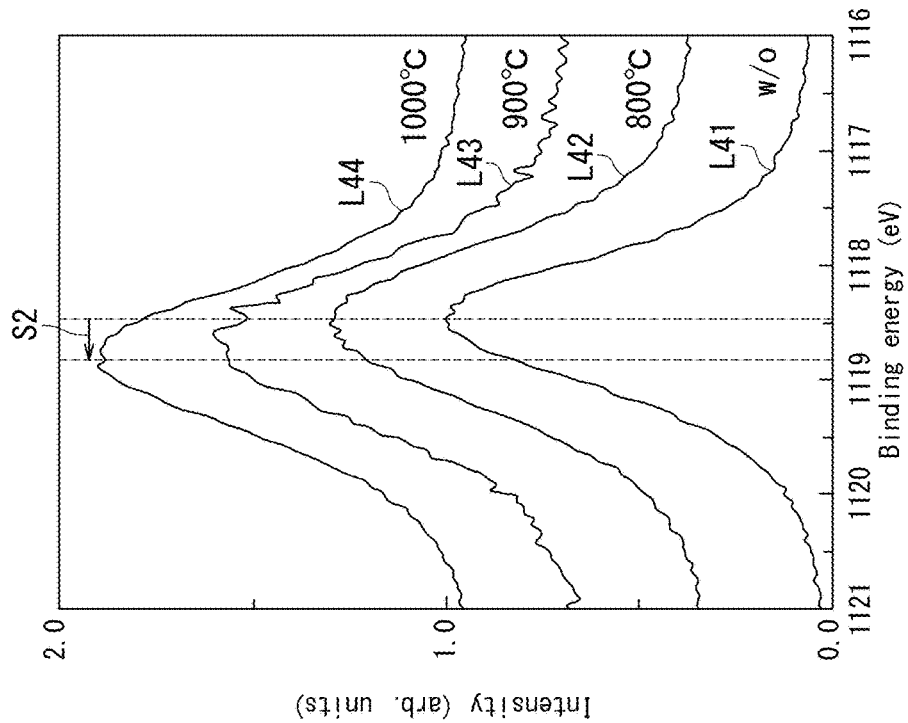
FIGS. 8A and 8B illustrate results of XPS analysis.
Figure 8A:
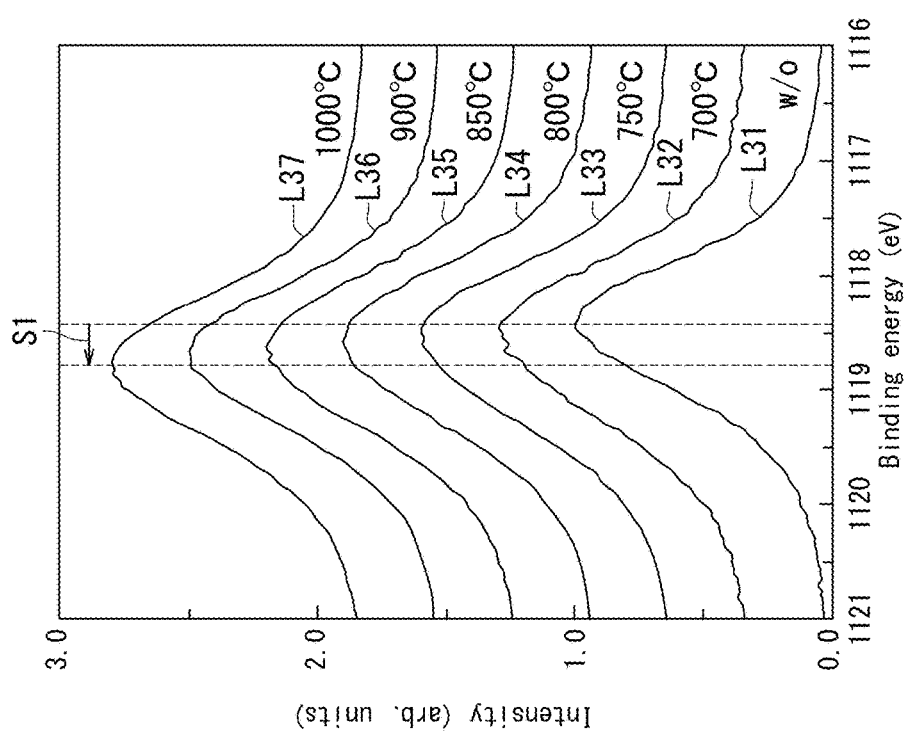

The following explains a chemical shift of $Ga2p_{3/2}$ spectra caused by thermal oxidation with reference to FIGS. 8A and 8B. FIGS. 8A and 8B each illustrate results of XPS analysis. FIG. 8A illustrates results of XPS analysis in a configuration in which the base layer 10 of the semiconductor device 100 is a GaN/Si substrate. FIG. 8B illustrates results of XPS analysis in a configuration in which the base layer 10 of the semiconductor device 100 is a free-standing GaN substrate. In FIGS. 8A and 8B, the horizontal axis represents binding energy and the vertical axis represents intensity (arbitrary units).

In FIG. 8A, data L31 indicates a $Ga2p_{3/2}$ spectrum in a situation in which no thermal oxidation was performed. Data L32, L33, L34, L35, L36, and L37 indicate $Ga2p_{3/2}$ spectra in situations in which thermal oxidation was performed at 700° C., 750° C., 800° C., 850° C., 90020 C., and 1000° C., respectively. In FIG. 8B, data L41 indicates a $Ga2p_{3/2}$ spectrum in a situation in which no thermal oxidation was performed. Data L42, L43, and L44 indicate $Ga2p_{3/2}$ spectra in situations in which thermal oxidation was performed at 800° C., 900° C., and 1000° C., respectively.

As indicated in FIG. 8A, the $Ga2p_{3/2}$ spectra are shifted toward higher energy levels by an increase in temperature of thermal oxidation. A shift amount S1 between the spectrum in a situation in which no thermal oxidation was performed and the spectrum in a situation in which thermal oxidation was performed at 1000° C. is about 0.4 eV.

Similarly, as indicated in FIG. 8B, the $Ga2p_{3/2}$ spectra are shifted toward higher energy levels by an increase in temperature of thermal oxidation. A shift amount S2 between the spectrum in a situation in which no thermal oxidation was performed and the spectrum in a situation in which thermal oxidation was performed at 1000° C. is about 0.4 eV.

As explained above with reference to FIGS. 8A and 8B, the amount of the chemical shift in a configuration in which the base layer 10 of the semiconductor device 100 is a GaN/Si substrate and the amount of the chemical shift in a configuration in which the base layer 10 is a free-standing GaN substrate were both about 0.4 eV and close to each other.

The following explains with reference to FIGS. 9A and 9B difference in oxidation rate between a configuration in which the base layer 10 is a GaN/Si substrate and a configuration in which the base layer 10 is a free-standing GaN substrate. FIGS. 9A and 9B each illustrate results of XPS analysis. FIG. 9A illustrates data of $Ga2p_{3/2}$ spectra in a situation in which thermal oxidation was performed at 800° C. FIG. 9B illustrates data of $Ga2p_{3/2}$ spectra in a situation in which thermal oxidation was performed at 900° C. In FIGS. 9A and 9B, data L51 indicates a $Ga2p_{3/2}$ spectrum in a configuration in which the base layer 10 is a GaN/Si substrate and data L52 indicates a $Ga2p_{3/2}$ spectrum in a configuration in which the base layer 10 is a free-standing GaN substrate. In FIGS. 9A and 9B, the horizontal axis represents binding energy and the vertical axis represents intensity (arbitrary units).

In both the results illustrated in FIGS. 9A and 9B, the $Ga2p_{3/2}$ spectrum (data L51) in a configuration in which the base layer 10 is a GaN/Si substrate is shifted toward higher energy levels relative to the $Ga2p_{3/2}$ spectrum (data L52) in a configuration in which the base layer 10 is a free-standing GaN substrate. This indicates that oxidation progresses faster in a configuration in which the base layer 10 is a GaN/Si substrate than in a configuration in which the base layer 10 is a free-standing GaN substrate even at the same thermal oxidation temperature. This difference in oxidation progress is due to difference in defect density of the substrates.

Figure 10:
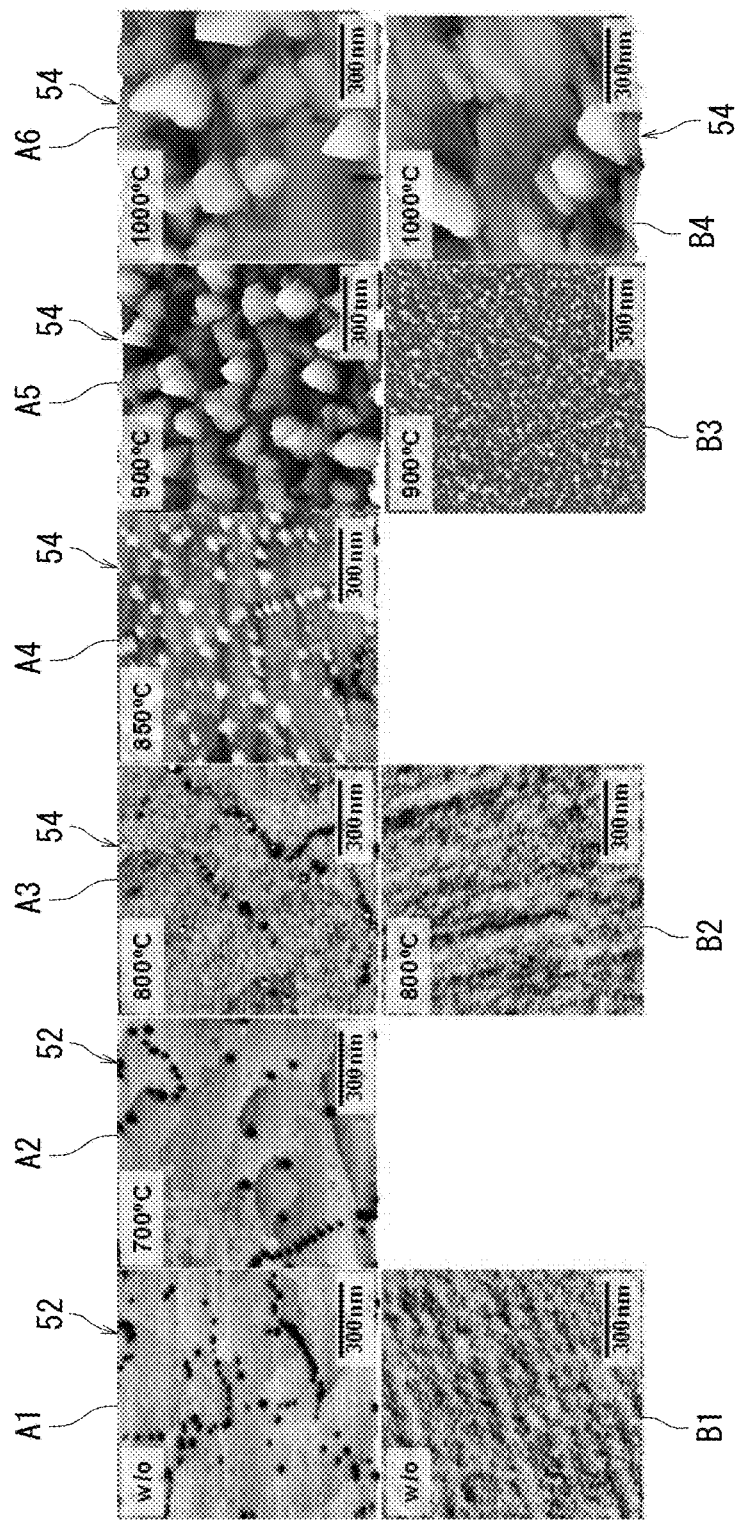
FIG. 10 presents photographs that are each an atomic force microscope image of a surface of an interface layer.
Figure 11:
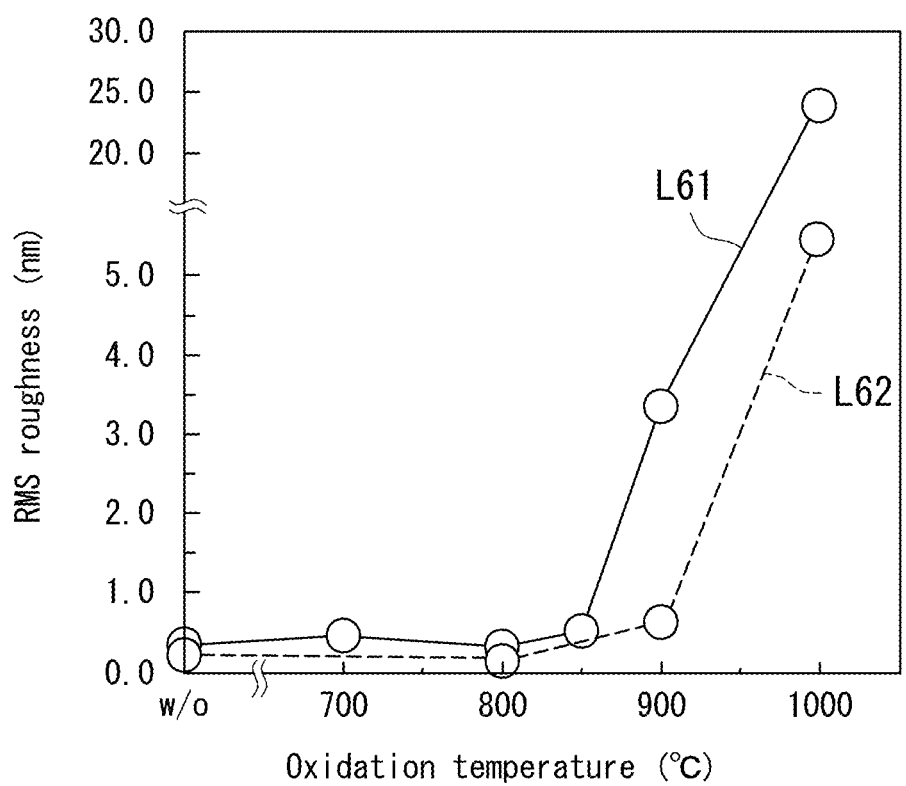
FIG. 11 illustrates a relationship between temperature of thermal oxidation and root mean square of surface roughness.

The following explains surface roughness of the interface layer 20 with reference to FIGS. 10 and 11. FIG. 10 presents photographs that are each an atomic force microscope (AFM) image of a surface of the interface layer 20. In FIG. 10, upper photographs (A1 to A6) are AFM images in a configuration in which the base layer 10 is a GaN/Si substrate and lower photographs (B1 to B4) are AFM images in a configuration in which the base layer 10 is a free-standing GaN substrate.

Photograph A1 is an AFM image of the surface of the interface layer 20 in a situation in which no thermal oxidation was performed. Photographs A2, A3, A4, A5, and A6 are AFM images of the surface of the interface layer 20 in situations in which thermal oxidation was performed at 700° C., 800° C., 850° C., 900° C., and 1000° C., respectively. Photograph B1 is an AFM image of the surface of the interface layer 20 in a situation in which no thermal oxidation was performed. Photographs B2, B3, and B4 are AFM images of the surface of the interface layer 20 in situations in which thermal oxidation was performed at 800° C., 900° C., and 1000° C., respectively.

In a configuration in which the base layer 10 is a GaN/Si substrate, a defect 52 is present on the surface of the interface layer 20 on the base layer 10 that is the GaN/Si substrate, as shown in photographs A1 and A2. As shown in photograph A3, gallium oxide ($Ga_2O_3$) 54 is preferentially formed on the defect 52 by thermal oxidation performed at 800° C. As shown in photographs A3 to A6, gallium oxide ($Ga_2O_3$) 54 grows into granules by an increase in temperature of thermal oxidation. In a situation in which no thermal oxidation was performed, a root mean square (RMS) of the surface roughness of the interface layer 20 is 0.31 nm. In situations in which thermal oxidation was performed at 700° C., 800° C., 850° C., 900° C., and 1000° C., the root mean square (RMS) of the surface roughness of the interface layer 20 is 0.45 nm, 0.31 nm, 0.51 nm, 3.35 nm, and 28.9 nm, respectively. As described above, the surface roughness of the interface layer 20 significantly increases by an increase in temperature of thermal oxidation.

By contrast, in a configuration in which the base layer 10 is a free-standing GaN substrate, no defect 52 is observed as shown in photograph B1. As such, no growth of gallium oxide ($Ga_2O_3$) 54 into large granules is observed even after thermal oxidation performed at 800° C. as shown in photograph B2. Further, as shown in photograph B3, fine granules of gallium oxide ($Ga_2O_3$) 54 are formed on the entire surface of the interface layer 20 by thermal oxidation performed at 900° C. As shown in photograph B4, gallium oxide ($Ga_2O_3$) 54 grows into fine granules by thermal oxidation performed at 1000° C. In a situation in which no thermal oxidation was performed, the root mean square (RMS) of the surface roughness of the interface layer 20 is 0.19 nm. In situations in which thermal oxidation was performed at 800° C., 900° C., and 1000° C., the root mean square (RMS) of the surface roughness of the interface layer 20 is 0.14 nm, 0.62 nm, and 6.03 nm, respectively.

FIG. 11 illustrates a relationship between temperature of thermal oxidation and root mean square of the surface roughness. In FIG. 11, the horizontal axis represents the temperature of thermal oxidation and the vertical axis represents the root mean square of the surface roughness. Data L61 indicates the root mean square of the surface roughness in a configuration in which the base layer 10 is a GaN/Si substrate and data L62 indicates the root mean square of the surface roughness in a configuration in which the base layer 10 is a free-standing GaN substrate.

In a configuration in which the base layer 10 is a GaN/Si substrate (data L61), thermal oxidation at a temperature of 900° C. significantly increases the root mean square of the surface roughness. By contrast, in a configuration in which the base layer 10 is a free-standing GaN/Si substrate (data L62), thermal oxidation at a temperature of 1000° C. significantly increases the root mean square of the surface roughness.

From the results explained with reference to FIGS. 10 and 11, it was found that formation of gallium oxide ($Ga_2O_3$) 54 on the defect 52 is a factor of faster oxidation progress in a configuration in which the base layer 10 is a GaN/Si substrate than in a configuration in which the base layer 10 is a free-standing GaN substrate.

Note that the root mean square of the surface roughness of the interface layer 20 is preferably greater than 0 nm and no greater than 5 nm. More preferably, the root mean square of the surface roughness of the interface layer 20 is greater than 0 nm and no greater than 1 nm.

The following explains another method for manufacturing the semiconductor device 100 according to an embodiment of the present invention with reference to FIGS. 12A to 12D. In the method for manufacturing the semiconductor device 100 explained with reference to FIGS. 2A to 2C, the interface layer 20 is formed prior to formation of the deposition layer 30. However, the interface layer 20 may be formed after formation of the deposition layer 30.

FIGS. 12A to 12D are cross-sectional views illustrating the method for manufacturing the semiconductor device 100 according to the embodiment of the present invention. Explanation of the same matter as that in the method for manufacturing the semiconductor device 100 explained with reference to FIGS. 2A to 2C will be omitted.

Figure 12A:
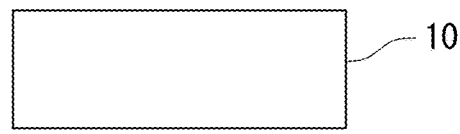
FIGS. 12A to 12D are cross-sectional views illustrating a method for manufacturing a semiconductor device according to an embodiment of the present invention.

As illustrated in FIG. 12A, the base layer 10 is prepared.

Figure 12B:
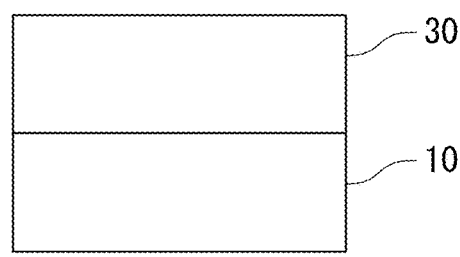

As illustrated in FIG. 12B, the deposition layer 30 is formed. In the present embodiment, the deposition layer 30 is formed adjacent to the base layer 10.

Figure 12C:
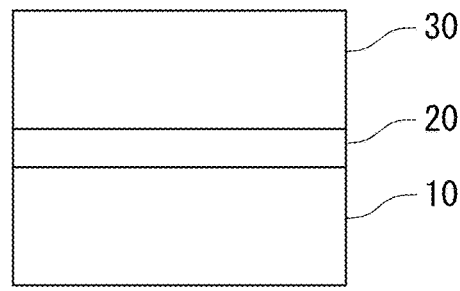

As illustrated in FIG. 12C, the interface layer 20 is formed by performing treatment on a surface of the base layer 10. The treatment in the present embodiment is oxidation. Examples of oxidation include dry oxidation performed at a temperature of at least 800° C. and no greater than 1000° C. Such oxidation is performed for example for 30 minutes. Oxidation performed after formation of the deposition layer 30 as in the present embodiment may be referred to as post-oxidation.

Figure 12D:
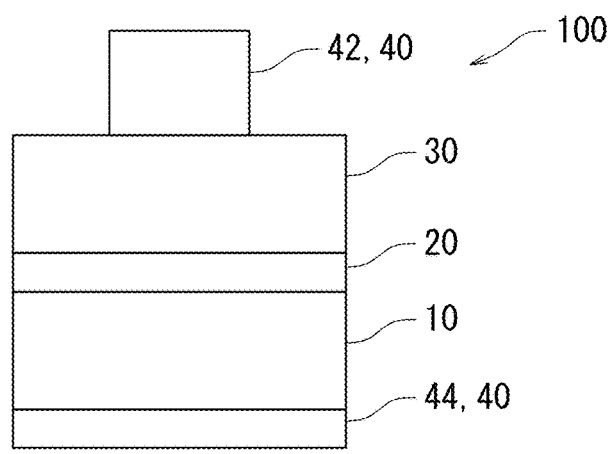

As illustrated in FIG. 12D, the electrode layers 40 are formed. Specifically, the first electrode layer 42 is formed adjacent to the deposition layer 30. Also, the second electrode layer 44 is formed adjacent to the base layer 10.

Figure 13:
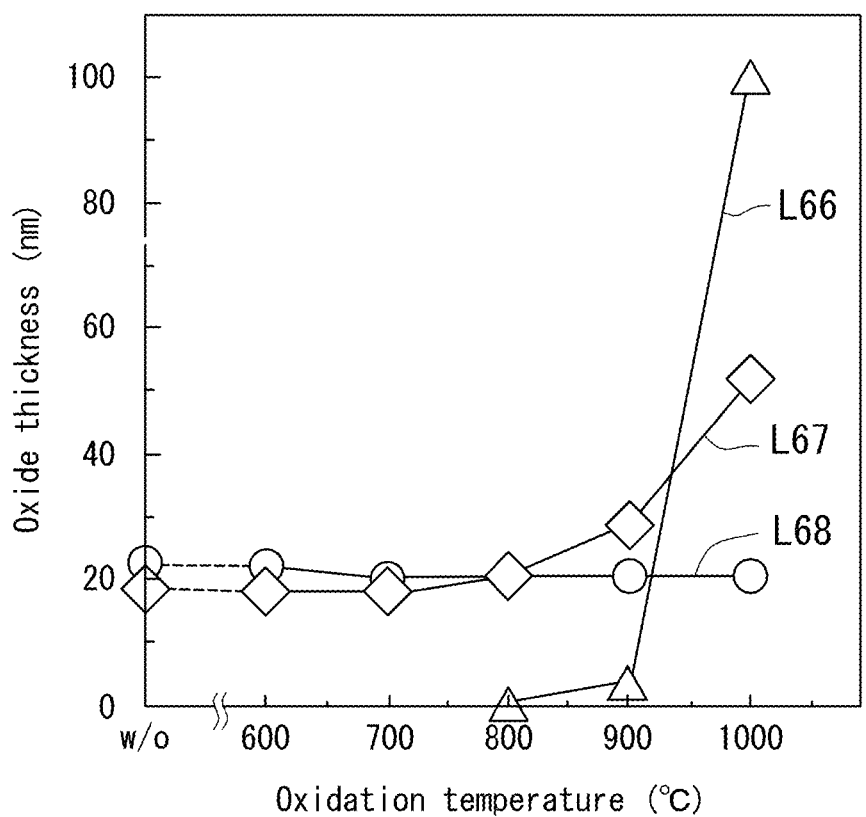
FIG. 13 illustrates a relationship between temperature of thermal oxidation and thickness of oxide films.

The following explains a relationship between temperature of thermal oxidation and thickness of oxide films with reference to FIG. 13. FIG. 13 illustrates the relationship between the temperature of thermal oxidation and the thickness of the oxide films. In FIG. 13, the horizontal axis represents the temperature of thermal oxidation and the vertical axis represents the thickness of the oxide films.

Data L66 indicates the film thickness of an oxide ($Ga_2O_3$) in a sample formed by oxidation of a gallium nitride (GaN) substrate. That is, the data L66 indicates the film thickness of the oxide ($Ga_2O_3$) in the sample produced by the method illustrated in FIGS. 2A to 2C. Data L67 indicates the film thickness of an oxide ($SiO_2$) in a sample formed by deposition of silicon oxide ($SiO_2$) on a silicon (Si) substrate and subsequent thermal oxidation of the substrate. Data L68 indicates the film thickness of an oxide ($Ga_2O_3$) in a sample formed by deposition of silicon oxide ($SiO_2$) on a gallium nitride (GaN) substrate and subsequent thermal oxidation of the substrate. That is, the data L68 indicates the film thickness of the oxide ($Ga_2O_3$) in the sample produced by the method illustrated in FIGS. 12A to 12D.

In the data L66, oxidation significantly progresses once the temperature of thermal oxidation is increased above 900° C. In a situation in which the temperature of thermal oxidation is 1000° C., an oxide ($Ga_2O_3$) layer as thick as 100 nm or more is formed.

In the data L67, oxidation of an Si surface ($SiO_2$/Si interface) under a cap layer of silicon oxide ($SiO_2$) gradually progresses once the temperature is increased above about 800° C. In a situation in which the temperature of thermal oxidation is 1000° C., the thickness of the oxide ($SiO_2$) layer reaches 52 nm. This indicates that oxygen in the atmosphere is dispersed into the $SiO_2$ layer and supplied to the Si surface.

By contrast, in the data L68, although it is thought that oxygen in the atmosphere is dispersed into the $SiO_2$ layer and supplied to the gallium nitride (GaN) substrate in a manner similarly to that in the data L67, the film thickness of the oxide is almost unchanged while the temperature of thermal oxidation is increased to 1000° C.

Figure 14:
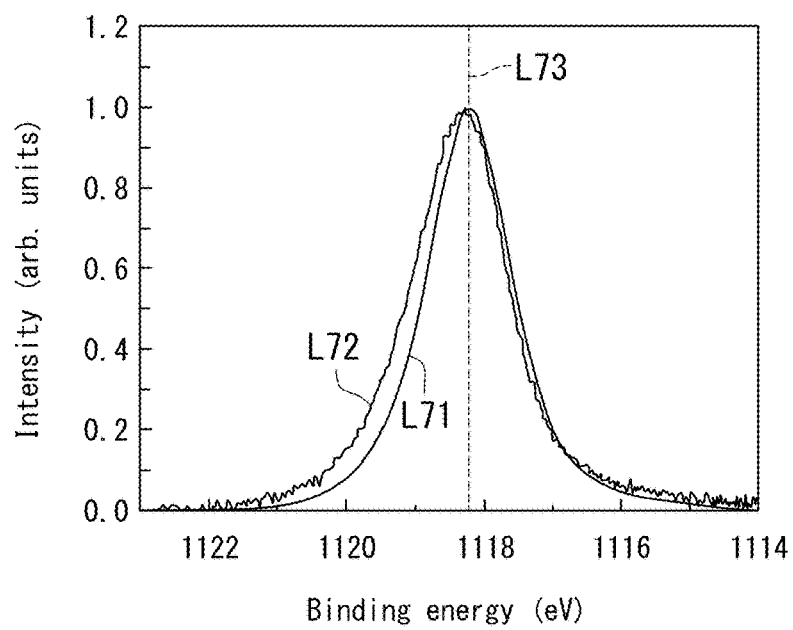
FIG. 14 illustrates results of XPS analysis.

The following explains a chemical shift of a $Ga2p_{3/2}$ spectrum caused by post-oxidation with reference to FIG. 14. FIG. 14 illustrates results of XPS analysis. Data L71 indicates results of XPS analysis of a GaN substrate. Data L72 indicates results of XPS analysis of a sample prepared through post-oxidation. Data L73 indicates a peak position in the XPS analysis of the GaN substrate. As indicated in FIG. 14, the $Ga2p_{3/2}$ spectrum of the data L72 is shifted toward higher energy levels relative to the $Ga2p_{3/2}$ spectrum of the data L71. Thus, growth of an extremely thin $Ga_2O_3$ interface layer can be confirmed.

Figure 15:
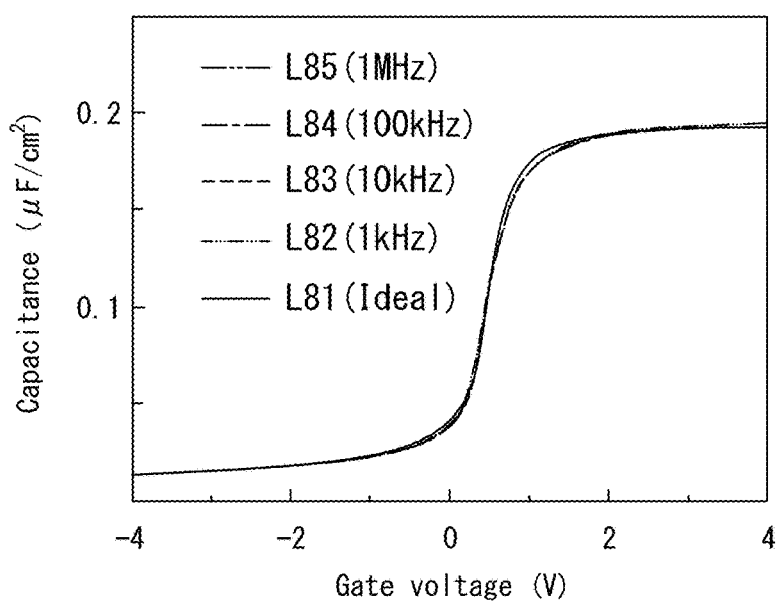
FIG. 15 illustrates C-V characteristics of a semiconductor device according to an embodiment of the present invention.

The following explains C-V characteristics of the semiconductor device 100 according to an embodiment of the present invention with reference to FIG. 15. FIG. 15 illustrates the C-V characteristics of the semiconductor device 100 according to the embodiment of the present invention. FIG. 15 illustrates the CV characteristics of a sample subjected to post-oxidation at 800° C. In FIG. 15, the horizontal axis represents gate voltage and the vertical axis represents capacitance. In FIG. 15, data L81 (solid line) indicates data of ideal values. Data L82 (dash three-dot line) indicates data measured at a measurement frequency of 1 kHz. Data L83 (dash line) indicates data measured at a measurement frequency of 10 kHz. Data L84 (dash-dot line) indicates data measured at a measurement frequency of 100 kHz. Data L85 (dash-dot-dot line) indicates data measured at a measurement frequency of 1 MHz.

As indicated in FIG. 15, C-V curves measured at all the measurement frequencies (data L82 to L85) are substantially the same as a C-V curve of the data L81 of the ideal values. As such, frequency dispersion converges through the post-oxidation.

In the methods for manufacturing the semiconductor device 100 explained with reference to FIGS. 2A to 2C and 12A to 12D, the interface layer 20 is formed by oxidation. However, the interface layer 20 may be formed by sputtering. Thermal treatment (annealing) is preferably performed after sputtering.

Figure 16A:
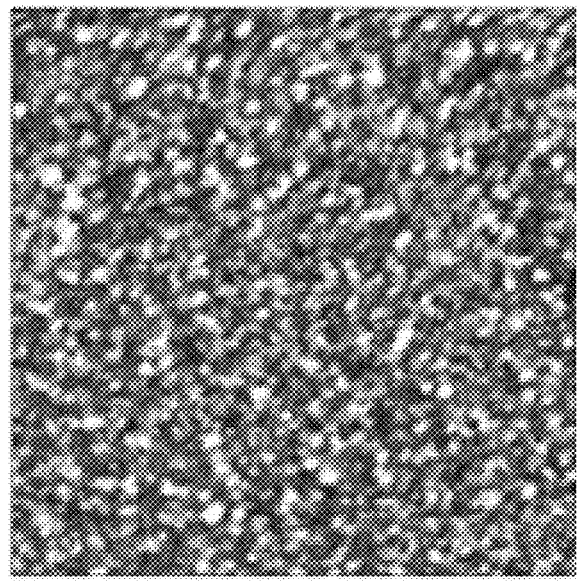
FIGS. 16A and 16B each are a photograph of an atomic force microscope image of a surface of an interface layer.
Figure 16B:
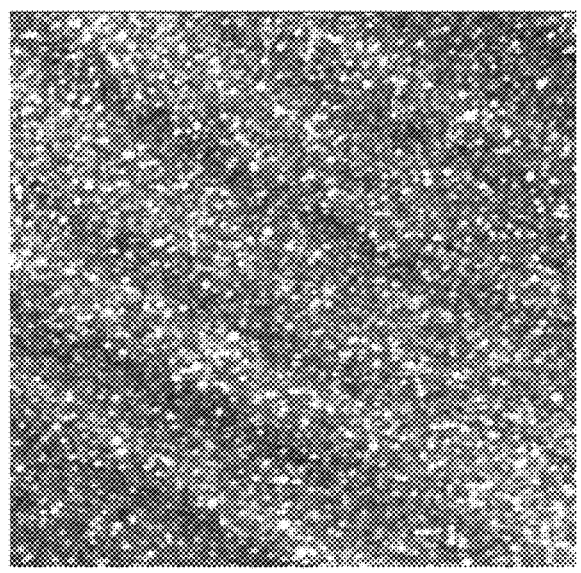

The following explains surface roughness of the interface layer 20 with reference to FIGS. 16A and 16B. FIGS. 16A and 16B each are a photograph of an atomic force microscope (AFM) image of a surface of the interface layer 20. FIG. 16A is a photograph of an AFM image of the surface of the interface layer 20 formed by thermal oxidation. FIG. 16B is a photograph of an AFM image of the surface of the interface layer 20 formed by sputtering.

The interface layer 20 in the photograph of FIG. 16A has a thickness of 3.7 nm. The interface layer 20 in the photograph of FIG. 16B has a thickness of 4 nm. It was confirmed that fine crystal grains were formed on the interface layer 20 formed by sputtering as shown in FIG. 16B as well as on the interface layer 20 formed by the thermal oxidation as shown in FIG. 16A. This is because after a film was formed by sputtering, a part of the film was crystallized through thermal treatment (annealing) performed at 800° C. Therefore, it is preferable to perform thermal treatment (annealing) after formation of a film by sputtering. Thermal treatment is for example performed at a temperature between 800° C. and 1000° C. A root mean square of the surface roughness of the interface layer 20 formed by thermal oxidation was 0.62 nm, and a root mean square of the surface roughness of the interface layer 20 formed by sputtering was 0.38 nm.

Figure 17A:
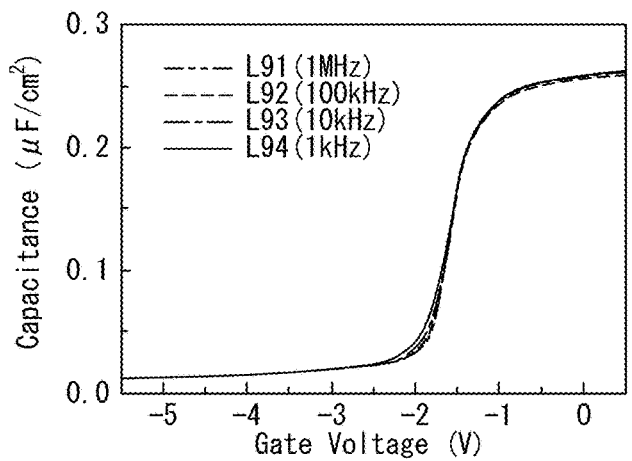
FIGS. 17A to 17C each illustrate C-V characteristics of a semiconductor device including an interface layer formed by sputtering.
Figure 17B:
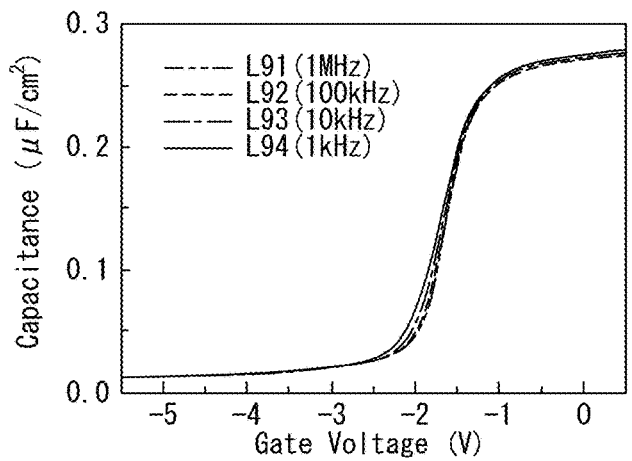
Figure 17C:
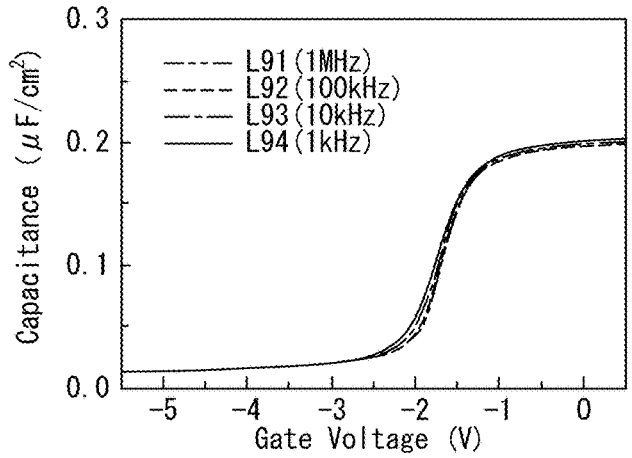

The following explains C-V characteristics of the semiconductor device 100 according to an embodiment of the present invention with reference to FIGS. 17A to 17C. FIGS. 17A to 17C illustrate the C-V characteristics of the semiconductor device 100 including the interface layer 20 formed by sputtering. In FIGS. 17A to 17C, the horizontal axis represents gate voltage and the vertical axis represents capacitance. In FIGS. 17A to 17C, data L91 (dash-dot-dot line) indicates data measured at a measurement frequency of 1 MHz. Data L92 (dash line) indicates data measured at a measurement frequency of 100 kHz. Data L93 (dash-dot line) indicates data measured at a measurement frequency of 10 kHz. Data L94 (solid line) indicates data measured at a measurement frequency of 1 Hz.

FIG. 17A illustrates data in a configuration in which the thickness of the interface layer 20 is 2 mm. FIG. 17B illustrates data in a configuration in which the thickness of the interface layer 20 is 4 mm. FIG. 17C illustrates data in a configuration in which the thickness of the interface layer 20 is 11 mm. Note that FIGS. 17A to 17C each illustrate only C-V curves as results of measurement in a direction from negative to positive in order to avoid complication of the drawings.

As indicated in FIGS. 17A to 17C, frequency dispersion is extremely narrow also in a configuration with the interface layer 20 was formed by sputtering. Thus, interface characteristics are improved.

Through the above, the embodiments of the present invention have been explained with reference to the drawings (FIGS. 1 to 17C). It should be noted that the present invention is not limited to the above embodiments and practicable in various manners within a scope not departing from the gist of the present invention. The drawings schematically illustrate elements of configuration in order to facilitate understanding. Properties of the elements of configuration illustrated in the drawings such as thickness, length, and number may differ from actual properties thereof in order to facilitate preparation of the drawings. Materials, shapes, dimensions, etc. of the elements of configuration given in the above embodiments are merely examples that do not impart any particular limitations and may be altered in various ways, so long as such alterations do not substantially deviate from effects of the present invention.

In the methods for manufacturing the semiconductor device 100 explained with reference to FIGS. 1 to 17C, dry oxidation is performed to form the interface layer 20. However, the treatment for forming the interface layer 20 is not limited to dry oxidation so long as the interface layer 20 can be formed by the treatment performed on the surface of the base layer 10. The treatment may for example be oxidation using an oxidizing agent other than oxygen molecules. The oxidizing agent is for example a nitrogen oxide (NOx) gas. Alternatively, the treatment may be radical oxidation using active oxygen. Alternatively, the treatment may be oxidation performed in a solution. The solution is for example a glycol solution. Alternatively, a thermal treatment may be performed after formation of gallium oxide at room temperature.

REFERENCE SIGNS LIST

10 Base layer
20 Interface layer
30 Deposition layer
100 Semiconductor device

What is claimed is:
1. A semiconductor device, comprising:
a base layer including a nitride semiconductor that contains gallium;
an interface layer that is adjacent to the base layer and that contains gallium oxide; and
a deposition layer that is adjacent to the interface layer and that has a wider band gap than the interface layer, wherein
the interface layer contains α-phase $Ga_2O_3$.
2. The semiconductor device according to claim 1, wherein
the interface layer has crystallinity.
3. The semiconductor device according to claim 1, wherein
the interface layer further contains β-phase $Ga_2O_3$, and
the α-phase $Ga_2O_3$ occupies a larger volume in the interface layer than the β-phase $Ga_2O_3$.
4. The semiconductor device according to claim 1, wherein crystal orientation of the gallium oxide in the interface layer matches with crystal orientation of the nitride semiconductor in the base layer.

5. The semiconductor device according to claim 1, wherein
the interface layer has a thickness greater than 0 nm and no greater than 10 nm.

6. The semiconductor device according to claim 1, wherein the interface layer has a smaller thickness than the deposition layer.

7. The semiconductor device according to claim 1, wherein
a root mean square of surface roughness of the interface layer is greater than 0 nm and no greater than 5 nm.

8. The semiconductor device according to claim 7, wherein
the root mean square of the surface roughness of the interface layer is greater than 0 nm and no greater than 1 nm.

9. The semiconductor device according to claim 1, wherein
a surface of the base layer in contact with the interface layer is formed from gallium nitride, and
the interface layer has crystallinity.

10. The semiconductor device according to claim 1, further comprising
an electrode layer that is adjacent to the deposition layer, wherein
a surface of the base layer in contact with the interface layer is entirely formed from gallium nitride.

* * * * *